United States Patent [19]

Sakurai

[11] Patent Number: 4,866,677

[45] Date of Patent: Sep. 12, 1989

[54] SEMICONDUCTOR MEMORY DEVICE WITH MULTIPLE ALTERNATING DECODERS COUPLED TO EACH WORD LINE

[75] Inventor: Takayasu Sakurai, Tokyo, Japan

[73] Assignee: Kabushiki Kaisha Toshiba, Kawasaki, Japan

[21] Appl. No.: 208,786

[22] Filed: Jun. 17, 1988

Related U.S. Application Data

[63] Continuation of Ser. No. 761,509, Aug. 1, 1985, abandoned.

[30] Foreign Application Priority Data

Aug. 3, 1984 [JP] Japan ................... 59-163510

[51] Int. Cl.[4] ................ G11C 7/00; G11C 8/00
[52] U.S. Cl. ................. 365/222; 365/230.05; 365/230.06; 365/189.04
[58] Field of Search ............. 365/230, 233, 210, 222, 365/51, 189

[56] References Cited

U.S. PATENT DOCUMENTS

| | | | |
|---|---|---|---|
| 4,044,339 | 8/1977 | Berg | 340/173 R |
| 4,104,719 | 8/1978 | Chu et al. | 364/200 |
| 4,106,108 | 8/1978 | Cislaghi et al. | 365/222 X |
| 4,203,159 | 5/1980 | Wanlass | 365/222 |
| 4,360,903 | 11/1982 | Plachno et al. | 365/233 |
| 4,435,787 | 3/1984 | Yasuoka | 365/190 |
| 4,623,990 | 11/1986 | Allen et al. | 365/189 X |
| 4,656,614 | 4/1987 | Suzuki | 365/230 X |
| 4,658,377 | 4/1987 | McElroy | 365/230 |
| 4,703,453 | 10/1987 | Shinoda et al. | 365/210 |
| 4,723,226 | 2/1988 | McDonough et al. | 365/230 |
| 4,740,923 | 4/1988 | Kaneko et al. | 365/230 |
| 4,769,789 | 9/1988 | Noguchi et al. | 365/189 X |

FOREIGN PATENT DOCUMENTS

| | | | |
|---|---|---|---|
| 0120485 | 10/1984 | European Pat. Off. | 365/230 |
| 2366265 | 10/1981 | Fed. Rep. of Germany | |
| 53-148348 | 12/1978 | Japan | |
| 55-25860 | 2/1980 | Japan | 369/230 |
| 59-60793 | 4/1984 | Japan | 365/230 |

OTHER PUBLICATIONS

Isobe et al., "A 46ns 256K CMOS RAM", ISSCC 1984 vol. 27, Cont. 31, pp. 214–215.

Fallin et al., "The Chip That Refreshes Itself", Computer Design vol. 22, No. 3 (1983), pp. 111–122.

Scarisbrick, "Large Scale Multi-Port Memories Permit Asynchronons Operation", Electronic Engineering, vol. 53, No. 650 (1981), pp. 27–30.

Kawamoto et al., "A 288Kb CMOS Pseudo SRAM," IEEE International Solid-State Circuits conference, pp. 276–277, Feb. 24, 1984.

*Primary Examiner*—Stuart N. Hecker
*Assistant Examiner*—Alfonso Garcia
*Attorney, Agent, or Firm*—Finnegan, Henderson, Farabow, Garrett, & Dunner

[57] ABSTRACT

A semiconductor memory device includes a first row decoder and memory cells M11 to MNL. The first row decoder receives the row address signal from an input buffer and a specific row fo a matrix array of memory cells M11 to MNL. The memory device further includes a second row decoder, a refresh address generator, a timing controller and switching circuits. The second row decoder selects a specific row of the matrix array according to a refresh address derived from the refresh address generator. The output terminals of the first and second row decoders, are connected to the memory cells through groups of switching circuits. The timing controller selectively renders conductive either the switching circuit group.

13 Claims, 5 Drawing Sheets

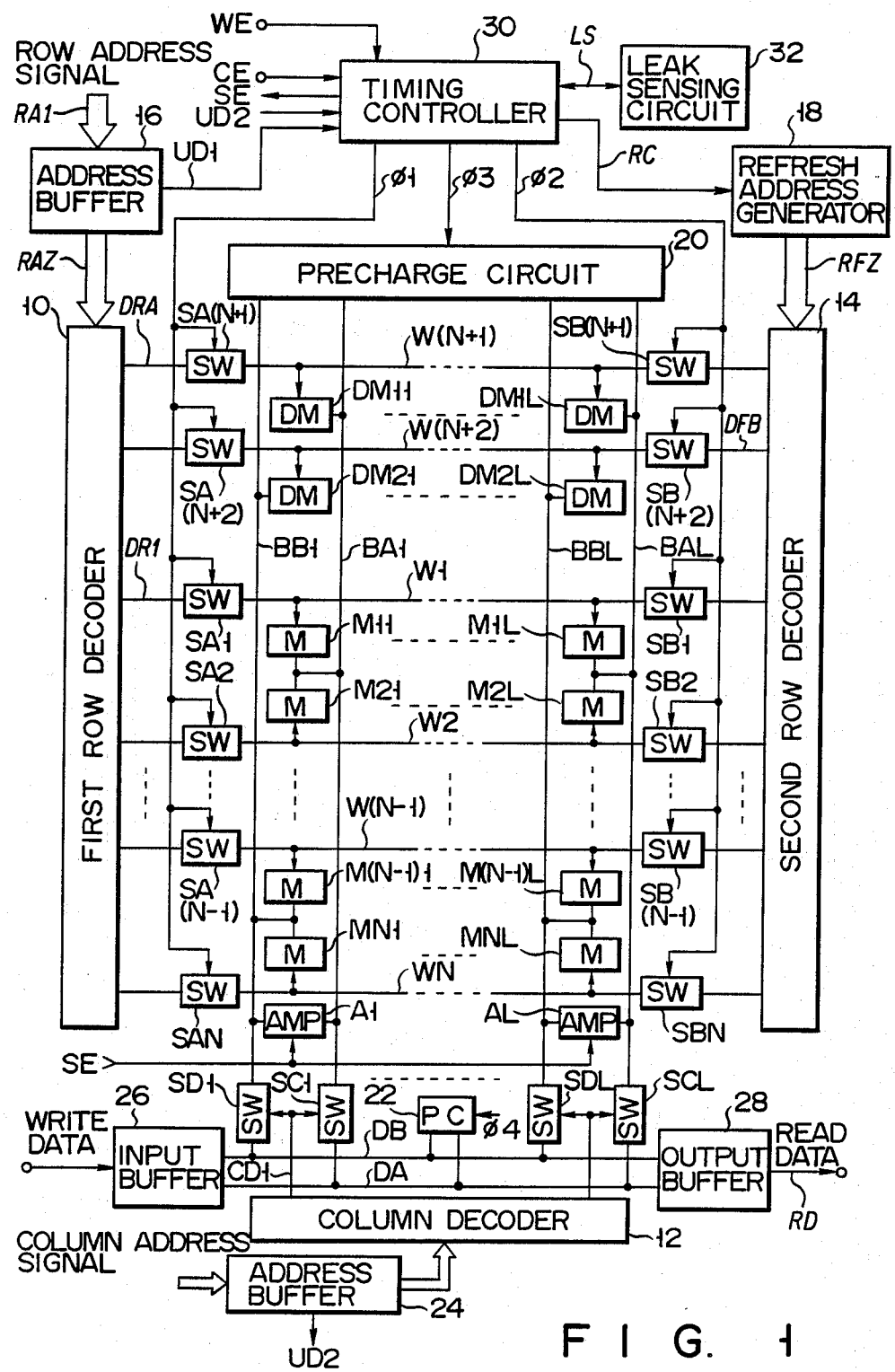
F I G. 1

SEMICONDUCTOR MEMORY DEVICE WITH MULTIPLE ALTERNATING DECODERS COUPLED TO EACH WORD LINE

This application is a continuation, of application Ser. No. 06/761,509, filed Aug. 1, 1985, now abandoned.

BACKGROUND OF THE INVENTION

This invention relates to a semiconductor memory device.

Semiconductor memory devices are used indispensably as the main memories of modern computer systems. In general, a semiconductor memory device is comprised of a plurality of memory cells matrix arrayed on a semiconductor chip, as well as of row and column decoders for decoding row and column address signals. The row decoder is connected to word lines laid along rows of a memory cell matrix so that memory cells arrayed in the same row can be selected by the row decoder through the associated word line. Similarly, bit lines are laid along columns of the matrix array. The memory cells in the same column can be selected by the column decoder through the associated bit line.

The dynamic RAMs have been used predominantly for recent high density semiconductor memory devices. The memory cell of the dynamic RAM has a relatively simple structure in that its essential elements are, for example, a capacitor and a transfer gate. The current path of the transfer gate is connected between the capacitor and the bit line. A conduction state of the transfer gate is controlled by the row decoder through the associated word line. The memory cell stores binary data "0" or "1" according to a charge amount of the capacitor. Charge in the capacitor tends to decrease with time due to a leakage current in the semiconductor chip. In the case of the dynamic RAM, therefore, the memory cells must be refreshed to maintain their validity before data in the capacitor volatilizes due to a current leak. As a means of refreshing a memory cell, data in the memory cell is read out and the same data as that read out is rewritten into the same memory cell. To be more specific, a bit line is precharged up to a predetermined potential, e.g., 5 V. Then, the transfer gate is turned on, and the potential of the bit line is varied according to the charge amount of the capacitor. A potential variation of the bit line is sensed, as the contents of the memory cell, by, for example, a sense amplifier. The sense amplifier sets the bit line potential to 0 V or 5 V according to the sensed data, and either charges or discharges the capacitor. Then, the transfer gate is turned off so that a predetermined amount of charge is held in the capacitor. In the dynamic RAM of 256 K bits, for example, because the capacitors are discretely manufactured and minute in size, each capacitor cannot store a large amount of charge. Conventionally, all of the memory cells of the dynamic RAM are cyclically refreshed at periods of 4 ms or less. If the refresh cycle has a period of more than 4 ms, there is a great possibility that the data in the memory cells may be altered to become erroneous data.

Usually, in the dynamic RAMs, the refresh operation and the normal operation (i.e., read/write operation) are assigned to independent time bands, so that the memory cells can be periodically refreshed exclusive of other functions. In the refresh mode, the bit lines are used solely for refreshing the memory cells. For this reason, these bit lines cannot be used for the read/write operation. To avoid an erroneous operation, access to the dynamic RAM is prohibited during the refresh operation, this being one of the major negative factors serving to reduce the effective access speed of the dynamic RAM. Moreover, in designing a dynamic RAM, a designer must allow for the refresh timings of the dynamic RAM, a consideration which places an undue mental load upon the designer.

As for the layout and the connection of the components, the word lines are laid in the row direction of the memory cell matrix array, while the row decoder has multi-input logic gates which are directed in the column direction and disposed adjacent the ends of the word lines. The multi-input logic gates are connected for reception to row and refresh address signals through a plurality of address lines which are extended along the multi-input logic gates. The address input lines have a relatively large stray capacitance of, for example, 10 pF. Because of this large stray capacitance, it takes approximately 5 ns before the address line is set to a predetermined potential after the update of the address signal. Additionally, about 6 ns is taken for decoding the received address signal, since the multi-input logic gate is a combination of a plurality of NAND gates. How to reduce such a time delay associated with the decoding operation, for the purpose of improving the operation speed of the memory device, is a most significant problem in this field.

SUMMARY OF THE INVENTION

Accordingly, an object of the present invention is to provide a semiconductor memory device with an extremely short access time.

To achieve the above object, there is provided a semiconductor memory device comprising first and second decoding circuits for generating decode signals in accordance with respective first and second address signals, a memory section including a plurality of memory cells which are selectively actuated by an input decoded signal, a transfer circuit for transferring a selected one of first and second decode signals to the memory section, and a control section for selecting one of first and second decode signals and permitting the transfer circuit to transfer the selected decode signal.

According to an aspect of this invention, the semiconductor memory device is provided with a second decoding circuit, in addition to the first decoding circuit. The output signals of the first and second decoding circuits are supplied to the first and second gate sections of the transfer circuit. Under the control of the control section, the memory section receives the output signal of either the first or the second gate sections. The memory cells of the memory cells are selectively actuated by the received decode signal. While one specific memory cell is actuated by the output signal of either the first or second decoding circuit, the other decoding circuit can concurrently perform the decoding operation to specify another memory cell. For this reason, the decoding time required for the selection of the memory cells can be reduced.

BRIEF DESCRIPTION OF THE DRAWINGS

FIG. 1 is a block diagram or a semiconductor memory device according to an embodiment of this invention;

DETAILED DESCRIPTION OF THE PREFERRED EMBODIMENTS

Figure 2:
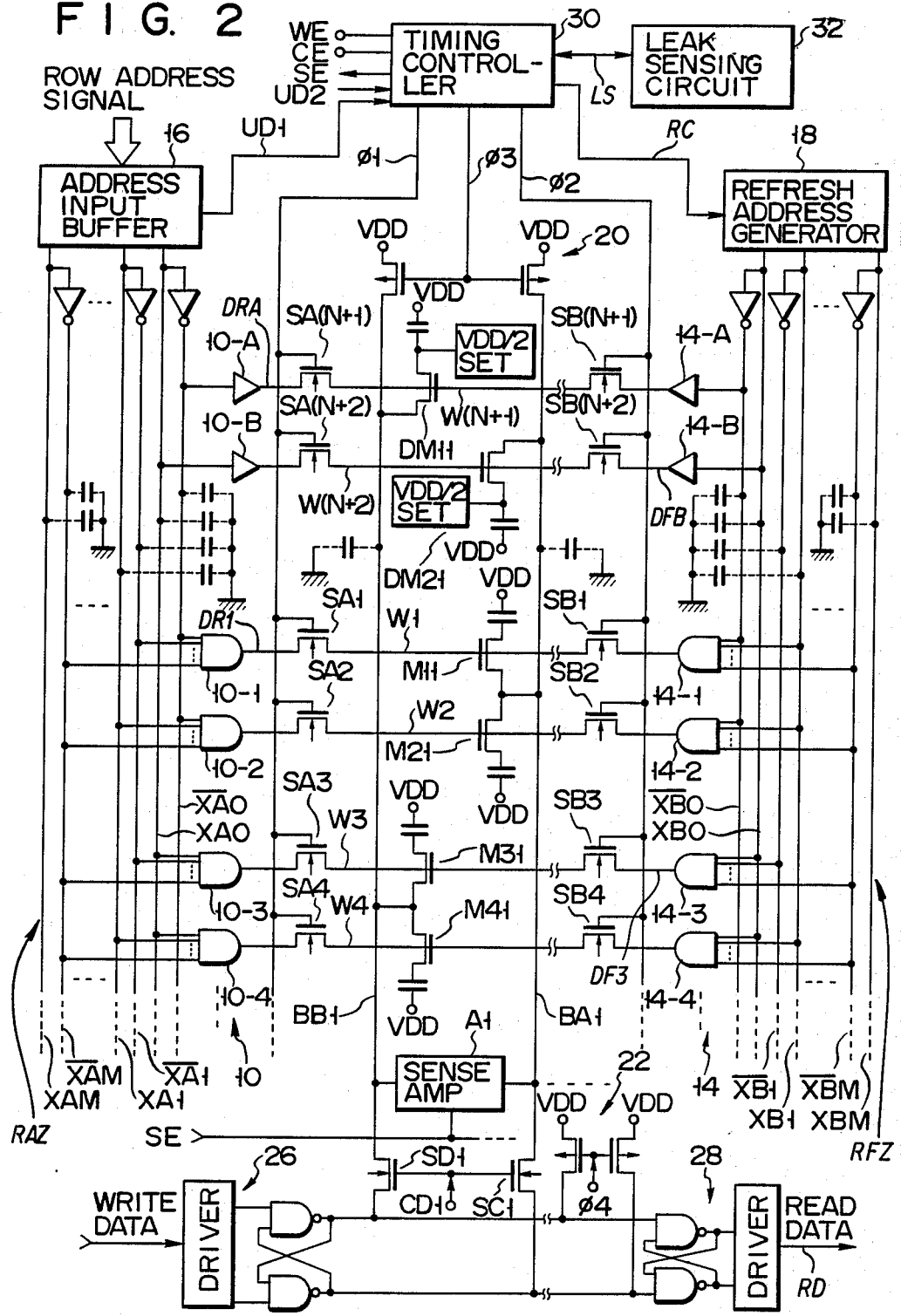
FIG. 2 is a circuit diagram of a part of the semiconductor memory device of FIG. 1.

A semiconductor memory device according to an embodiment of this invention will be described referring to FIGS. 1 and 2. FIG. 1 illustrates a semiconductor memory device with a memory capacity of N×L bits. FIG. 2 shows, in detail, a part of the semiconductor memory device of FIG. 1. The memory device includes memory cells M11 to MNL of N×L matrix arrayed on a semiconductor chip, and dummy memory cells DM11 to DM2L of 2×L. Each of the memory cells M11 to MNL and DM11 to DM2L is a one-bit memory of the dynamic type, made up of a capacitor and a transfer gate, as illustrated in FIG. 2. In these memory cells, each capacitor is connected between a power source terminal VDD set at, for example, 5 V, and one end of the current path of the associated transfer gate, the other end of the current path serving as a data terminal The transfer gates each respond to a select signal to be conducted.

The select signal passes through word lines W1 to WN, W(N+1) and W(N+2), which lie along rows of the matrices made up of the memory cells M11 to MNL and DM11 to DM2L, and is supplied to the memory cells in the corresponding rows, viz., those associated with the corresponding word lines. The control terminals of the transfer gates in the memory cells M11 to M1L, for example, are connected together with the word line W1. Similarly, the control terminals of the transfer gates in the dummy memory cells DM11 to DM1L are connected together with the word line W(N+1).

Each of the dummy memory cells DM11 to DM2L has a potential setting circuit which is connected to the junction between the transfer gate and the capacitor, and sets the potential of the junction at a level of VDD. L pairs of bit lines BA1, BB1 to BAL, BBL lie along columns of the memory matrix arrays of the memory cells M11 to MNL and DM11 to DM2L. The data terminals of the dummy memory cells DM11 to DM1L are connected to the bit lines BA1 to BAL, respectively, while the data terminals of the dummy cells DM21 to DM2L are connected to bit lines BB1 to BBL, respectively. Bit lines BA1 to BAL are connected to the data terminals of the memory cells in the predetermined rows. The memory cells M11 to M1L, for example, are connected to the bit lines BA1 to BAL, respectively. The bit lines BB1 to BBL are connected to the data terminals of the memory cells in the remaining rows. For example, the data terminals of the memory cells M(N−1)1 to M(N−1)L are connected to the bit lines BB1 to BBL, respectively. The data terminals of the memory cells, particularly in the adjacent two rows, are connected together with one of the paired bit lines BA1, BB1 to BAL, BBL in each column. For example, the data terminals of the memory cells M21 to M2L, together with those of the memory cells M11 to M1L, are connected to the bit lines BA1 to BAL, respectively. Similarly, the data terminals of the memory cells MN1 to MNL, together with those of the memory cells M(N−1)1 to M(N−1)N, are connected to the bit lines BB1 to BBL, respectively.

The semiconductor memory device includes, for a normal mode operation, a first row decoder 10 and a column decoder 12 and, for a refresh mode operation, further includes a second row decoder 14. The first and the second row decoders 10 and 14 include AND gates 10-1 to 10-N and 14-1 to 14-N in the rows of the matrix of the memory cells M11 to MNL, and two buffer gates 10-A, 10-B, 14-A and 14-B in the rows of the matrix of the dummy memory cells DM11 to DM2L. The output terminals of the AND gates 10-1 to 10-N and 14-1 to 14-N are used as the first output terminals of the first and second row decoders 10 and 14. The output terminals of the buffer gates 10-A, 10-B and 14-A, 14-B serve as the second output terminals of the first and second row decoders 10 and 14. The word lines W1 to WL are connected to the first input terminals of the first row decoder 10, through switching circuits SA1 to SAN, whose conduction state is controlled by a control signal $\phi 1$. These word lines are further connected to the first output terminals of the second row decoder 14, through switching circuits SB1 to SBN, whose conduction state is controlled by a control signal $\phi 2$. The word lines W(N+1) and W(N+2) are connected to the second output terminals of the first row decoder 10, by way of switching circuits SA(N+1) and SA(N+2), whose conduction state is controlled by the control signal $\phi 1$. The same are also connected to the second output terminals of the second row decoder 14, by way of switching circuits SB(N+1) and SB(N+2), whose conduction state is controlled by the control signal $\phi 2$. The switching circuits SA1 to SA(N+2) and SB1 to SB(N+2) are constructed with, for example, transfer gates, as shown in FIG. 2. The first row decoder 10 receives a row address signal via an address buffer 16. The address buffer 16 includes a circuit (not shown) for latching the row address signal, and a transition detector (not shown) which responds to the update of the row address signal. Upon receipt of the row address signal latched by and output from the address buffer 16, the first row decoder 10 produces select signals at the first and the second output terminals. Upon receipt of a refresh address signal from a refresh address generator 18, the second row decoder 14 produces select signals from one of the first output terminals and one of the second output terminals. More specifically, the first row decoder 10, as shown in FIG. 2, has address lines XA0 to XAM for directly receiving an address signal from the address buffer 16, and address lines $\overline{XA0}$ to $\overline{XAM}$ for receiving an address signal, through inverters, from the address buffer 16. The AND gates 10-1 to 10N, which are selectively connected to the address lines XA0 to XAM and $\overline{XA0}$ to $\overline{XAM}$, produce select signals in response to specific address signals. The buffer gates 10-A and 10-B are connected at the input terminals to the address lines $\overline{XA0}$ and XA0, respectively. The second row decoder 14 has address lines XB0 to XBM for directly receiving a refresh address signal from the refresh address generator 18, and address lines $\overline{XB0}$ to $\overline{XBM}$ for receiving an address signal, through inverters, from the refresh address generator 18. The AND gates 14-1 to 14-N are selectively connected to address lines XB0 to XBM and $\overline{XB0}$ to $\overline{XBM}$, and produce select signals in response to specific address signals. The buffer gates 14-A and 14-B are connected at the input terminals to the address lines $\overline{XB0}$ and XB0, respectively. The dummy memory cells DM11 to DM1L are selected concurrent with the memory cells in a specific row and whose data terminals are connected to the bit lines BB1 to BBL. The dummy memory cells DM21 to DM2L are selected concurrent with the memory cells in a specific row whose data terminals are connected, respectively, to the bit lines BA1 to BAL.

A precharge circuit 20 is responsive to a control signal $\phi 3$ to precharge the bit lines BA1 to BAL and BB1 to BBL to a potential of VDD. The precharge circuit 22 responds to a control signal $\phi 4$ to precharge the data lines DA and DB. In response to a sense enable signal SE, each sense amplifier A1 to AL senses potential differences between each bit line pair BA1, BB1, . . . , and BAL, BBL. According to the sensed potential difference, the precharge circuit 20 sets one of the paired bit lines to ground level, e.g., 0 V, while setting the other to VDD level, e.g., 5 V. For example, when the potential on the bit line BA1, after being precharged, changes, becoming lower than that on the bit line BB1, the potential of the bit lines BA1 and BB1 are set, respectively, to ground level and VDD level by the sense amplifier A1. The bit lines BA1 to BAL are connected to a data line DA, through switching circuits SC1 to SCL. The bit lines BB1 to BBL are connected to a data line DB, through switching circuits SD1 to SDL. A column address signal is latched in an address buffer 24, and supplied to the column decoder 12. The address buffer 24 has a transition detector (not shown) for detecting update of the column address signal. The column decoder 12 has L output terminals for selecting the columns of the matrix of the memory cells M11 to MNL, and produces a select signal from one of the output terminals in accordance with the column address signal. The output terminals of the column decoder 12 are connected to the switching circuits SC1, SD1, . . . , SCL, SDL in the corresponding columns for controlling the conduction state of each switching circuit. For example, the select signal CD1 renders both the switching circuits SC1 and SD1 in the first column conductive. An input buffer 26 latches write data of one bit, and, according to the latched data, sets the potential of one of the data lines DA and DB to VDD level, setting that of the other to ground level. An output buffer 28 latches, as the read out data, data according to the potential difference between the data lines DA and DB. The input buffer 26 and the output buffer 28 are each made up of two NAND gates and a driver, as best illustrated in FIG. 2.

The semiconductor memory device contains a timing controller 30. Under control of the timing controller 30, the timing of the decoding operations of the first and second decoders 10 and 14 overlap. A write enable signal WE is supplied to the timing controller 30 to control the read/write operation of the semiconductor memory device. A chip enable signal CE is supplied as a permission to access (PTA) signal to the timing controller 30. In addition to these signals, the output signals of the transition detectors and a leak sensing circuit 32 are applied to the timing controller 30. Upon receipt of these signals, the timing controller 30 produces control signals $\phi 1$ to $\phi 4$ with appropriate time differences, as well as a sense enable signal SE. The leak sensing circuit 32, containing capacitors equivalent to the capacitors in the memory cells M11 to MNL, applies a refresh request signal to the timing controller 30 before the data in the memory cells M11 to MNL volatilizes. More specifically, the leak sensing circuit 32 precharges the capacitors of the leak sensing circuit 32, per se, at the power on time. When the amount of charge in the capacitors diminishes to a predetermined value, the leak sensing circuit 32 makes a refresh request. At this time, the leak sensing circuit 32 precharges its capacitor in preparation for the next refresh request. When receiving a refresh request, the timing controller 30 supplies N pulses as refresh address update request signal to the refresh address generator 18 in the respective read/write cycles, with its periods each being equal to the update interval of the row address signal. The first refresh address update request is used as a reset signal.

Referring to the output signal from the transition detector of the address buffer 16, the timing controller 30 maintains the difference between the update timings of the row address signal and the refresh address signal. In response to each update request, the refresh address generator 18 sequentially changes the refresh address from a predetermined refresh address to the succeeding ones, and specifies all of the rows of the matrix of the memory cells M11 to MNL. The control signal $\phi 1$ is supplied to the switching circuits SA1 to SA(N+2) after the elapse of a time period from the update of the row address signal to generation of the select signal of the first row decoder 10. The switching circuits SA1 to SA(N+2) are held conductive for the time period taken for the data read/write by the control signal $\phi 1$. During this period, the control signal $\phi 2$ is not produced and the switching circuits SB1 to SB(N+1) re kept nonconductive. When a refresh request is generated, the timing controller 30 permits the refresh address generator 18 to generate the refresh address signal in synchronism with the change of the row address signal. The control signal $\phi 2$ is supplied to the switching circuits SB1 to SB(N+2) after a time period from the update of the refresh address signal to the generation of a select signal by the second row decoder 14, and the switching circuits SA1 to SA(N+2) are rendered nonconductive. The switching circuits SB1 to SB(N+1) are held conductive for the time period taken for refreshing the memory cells by the control signal $\phi 2$. The next row address is latched in the address buffer 16 during this refresh period, and subsequently decoded by the first row decoder 10. The timing controller 30 stops the generation of the control signal $\phi 2$ after this refresh period, and then generates the control signal $\phi 1$.

The operation of the semiconductor memory device thus arranged will be described referring to FIGS. 3A to 3N, and 3P. To access the memory cells M11 to MNL, the timing controller 30 receives a chip select signal. In a read out mode, a write enable signal WE is not supplied to the timing controller 30. The transition detectors of the address buffers 16 and 24 detect the update of the row and column address signals, and produce detected signals UD1 and UD2. For example, when the row address signal shown in FIG. 3A is updated at time T0 for designating the first row of the matrix of the memory cells M11 to MNL, a detection signal UD1 is fed from the address buffer 16 to the timing controller 30. In response to the detection signal UD1, the timing controller 30 produces a control signal $\phi 3$, shown in FIG. 3B. When the control signal $\phi 3$ is supplied to the precharge circuit 20, the precharge circuit 20 precharges the bit lines BA1 to BAL and BB1 to BBL to VDD level potential.

After the row address signal is latched in the address buffer 16, the first row decoder 10 receives the latched address signal at time T1, as shown in FIG. 3D. The time delay in this case is substantially equal to the time taken for the potential change of the address lines XA0 to XAM and $\overline{XA0}$ to XAM. Upon receipt of this address signal, the AND gate 10-1 and the buffer gate 10-A in the first row decoder 10 generate a select signal at time T2, as shown in FIG. 3E. This time delay is substantially equal to the response time of the AND gate 10-1 and the buffer gate 10-A. Assuming that the leak sensing circuit 32 supplies a refresh request to the timing controller 30, the timing controller 30 requests the refresh address generator 18 to update the refresh address after the elapse of a given time after the updating of the row address signal. The refresh address generator 18 generates, at time T3, for example, a refresh address signal to specify the third row of the matrix made up of the memory cells M11 to MNL, as shown in FIG. 3F. The AND gate 14-3 and the buffer gate 14-B in the second row decoder 14 receive, at time T4, a refresh address signal, as shown in FIG. 3G, and generate, at time T5, the select signals shown in FIG. 3H. The timing controller 30, as shown in FIG. 3M, generates a control signal $\phi1$ at time T6, which is previous to time T2, and renders the switching circuits SA1 to SA(N+2) conductive. The memory cells M11 to M1L and the dummy memory cells DM11 to DM1L receive select signals from the first row decoder 10 through the word lines W1 and W(N+1). FIG. 3I shows voltage variations of the word lines W1 and W(N+1).

Figure 3:
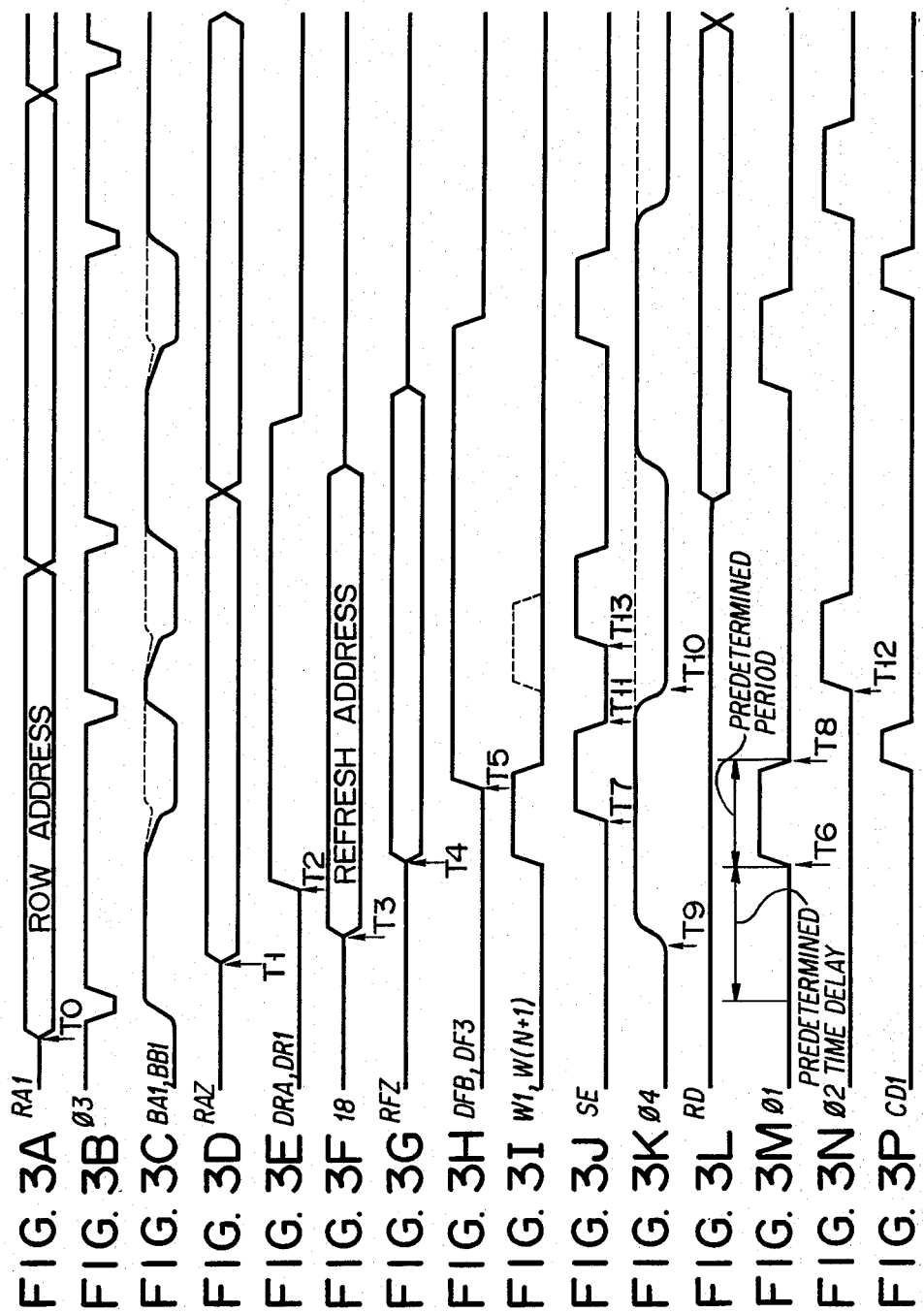
FIGS. 3A to 3N, and 3P show a set of waveforms for explaining the operation of the semiconductor memory device of FIG. 1.

When the transfer gates of the memory cells M11 to M1L and DM11 to DM1L are rendered conductive by the select signals, potentials of the bit lines BA1 to BAL and BB1 to BBL vary according to the amount of charge in the capacitors of the memory cells M11 to M1L and DM11 to DML. FIG. 3C shows potential variations of the bit lines BA1 and BB1. When charge is not stored in the capacitor of the memory cell M11, potential of the bit line BA1 varies as indicated by a solid line, while the potential of the bit line BB1 varies as indicated by a broken line. At time T7 the timing controller 30 generates a sense enable signal SE, as shown in FIG. 3J. The sense amplifiers A1 to AL detect potential differences between the paired bit lines BA1 and BB1, . . . , BAL and BBL. According to the detected potential difference, each sense amplifier A1 to AL sets to VDD level one of each pair of bit lines BA1 and BB1, . . . , BAL and BBL, while they set the others to ground level. In FIG. 3C, the bit line BA1 is set to 0 V, and the bit line BB1 to 5 V. Then, at time T8, the timing controller 30 stops the generation of the control signal $\phi1$, rendering the switching circuits SA1 to SA(N+2) nonconductive. The transfer gates in the memory cells M11 to M1L and DM11 to DM1L are turned off due to interruption of the select signals. The memory cells M11 to M1L store the data dependent on the potential of the bit line BA1. The timing controller 30 generates a control signal $\phi4$ at time T9, which is prior to time T7. The precharge circuit 22 responds to the control signal $\phi4$ to precharge the data lines DA and DB, as shown in FIG. 3K. The column decoder 12 completes its decoding operation at substantially the same time as the first row decoder 10 completes its decoding. A select signal CD1 is supplied from the column decoder 12 to the switching circuits SC1 and SD1 at time T12, as shown in FIG. 3P. The data lines DA and DB are set at the potential equal to that of the bit lines BA1 and BB1. The output buffer 28 latches, as read data, the data dependent on a potential difference between the data lines DA and DB, as shown in FIG. 3. The timing controller 30 stops the generation of the sense enable signal SE at time T11, which is prior to time T10, and produces a control signal $\phi3$. In response to the control signal $\phi3$, the precharge circuit 20 precharges the bit lines BA1 to BAL and BB1 to BBL to VDD level.

At time T12, following completion of the precharge, the timing controller 30 generates a control signal $\phi2$, as shown in FIG. 3N. The switching circuits SB1 to SB(N+2) are turned on by the control signal $\phi2$. The memory cells M31 to M3L and the dummy memory cells DM21 to DM2L receive the selected signals from the second row decoder 14. (A broken line, shown in FIG. 3I, represents each potential of word lines W3, W(N+2).) When the transfer gates of the memory cells M31 to M3L and DM21 to DM2L are rendered conductive by the select signal, the potentials of the bit lines BA1 to BAL and BB1 to BBL vary according to the charge amount of the capacitors of the memory cells M31 to M3L and DM21 to DM2L. The potentials on the bit lines BA1 and BB1 vary as shown in FIG. 3C. The timing controller 30 produces a sense enable signal SE at time T13, as shown in FIG. 3J. The sense amplifiers A1 to AL each detect a potential difference between the paired bit lines in the corresponding column. According to the potential difference detected, one of the paired bit lines is set to VDD level, and the other to ground level. As a result, all of the memory cells M31 to M3L in the third column are refreshed (FIGS. 3C and 3J). Then, the timing controller 30 stops the generation of the sense enable signal SE, and generates a control signal $\phi3$ in preparation for the read/write operation of the next row address signal, as shown in FIG. 3B.

In the above-mentioned embodiment, the first and second row decoders 10 and 14 decode the different address signals at different and predetermined times. When the first row decoder 10 selects specific rows of the matrices of the memory cells M11 to MNL and DM11 to DM2L, the switching circuits SA1 to SA(N+1) are rendered conductive, while the switching circuits SB1 to SB(N+1) are rendered nonconductive. When the second row decoder 14 selects specific rows of the matrices of the memory cells M11 to MNL and DM11 to DM2L, the switching circuits SB1 to SB(N+2) are rendered conductive, while the switching circuits SA1 to SA(N+2) are rendered nonconductive. A relatively long time is taken after the instant the row address signal and the refresh address signal are updated until the specific memory cells receive the select signal. The second row decoder 14 can execute decoding to select specific rows of the matrices of the memory cells M11 to MNL and DM11 to DM2L in concurrence with decoding by the first row decoder 10 for selecting the other specific rows. To this end, following the completion of the read/write operation of the memory cells selected by the first row decoder 10, the switching circuits SA1 to SA(N+1) are turned off, and the switching circuits SB1 to SB(N+2) are turned on. Therefore, the decoding time of the second row decoder 14 is substantially reduced. Further, when the refreshing of the memory cells selected by the second row decoder 14 is completed, the first row decoder 10 can quickly select other rows of the matrices of the memory cells M11 to MNL and DM11 to DM2L.

When using this semiconductor memory in a computer system, the ease with which a designer can design such a system is much improved as compared with the design of the system using the conventional dynamic RAM. If the conventional semiconductor memory device is used, the designer need always allow for the refresh timing. In the semiconductor memory device of this invention, the refreshing of memory cells is automatically performed within a read/write cycle, as shown in FIG. 3A. Therefore, the designer can design the computer system without any regard for the refresh time.

In this embodiment, the leak sensing circuit 32 is provided for checking a change in the charge amount of the memory cell. This may be replaced by a timer in which refresh intervals are preset.

The switching circuits SA1 to SA(N+2) and SB1 to SB(N+2) are constructed with MOS type transfer gates. The MOS type transfer gates may be replaced by any other suitable gates, for example, CMOS type transfer gates, clocked CMOS gates, etc.

Figure 4:
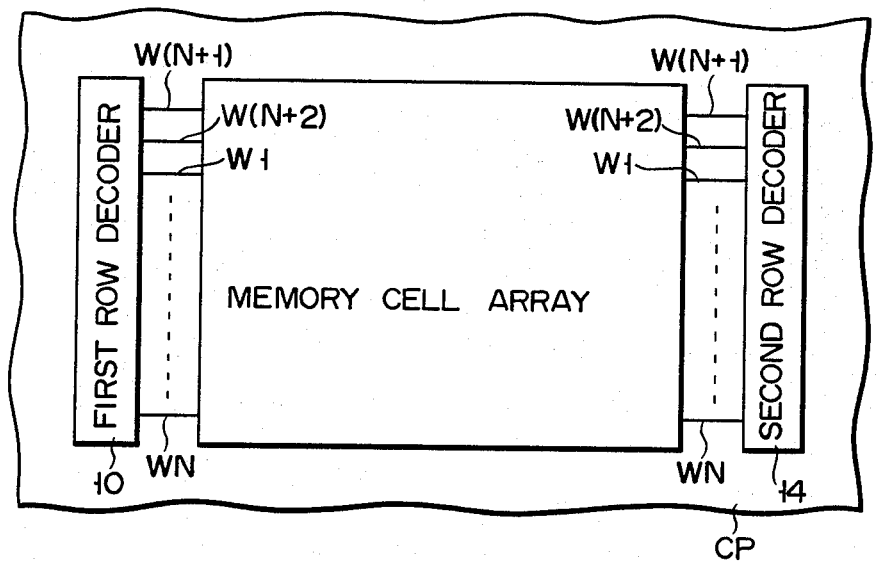
FIG. 4 how the memory cell array and the first and second decoders in FIG. 1 are laid out on a semiconductor chip.
Figure 5:
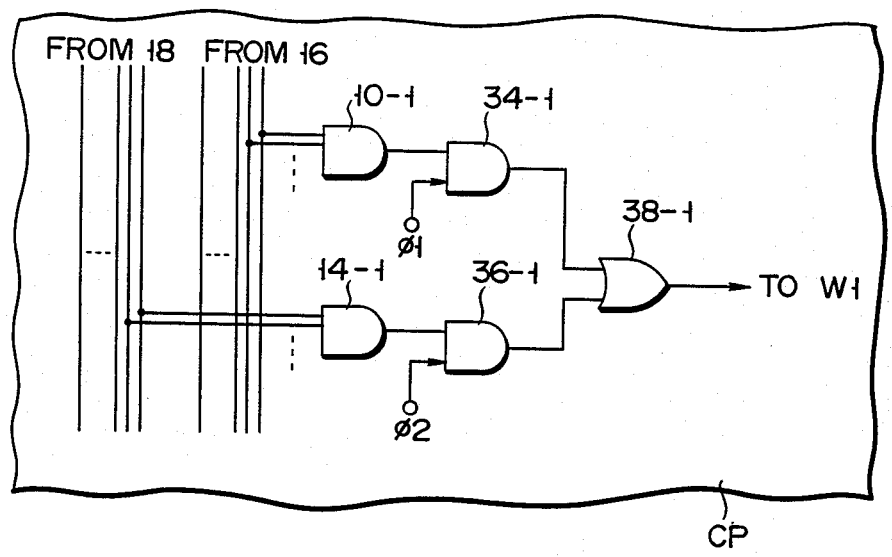
FIG. 5 shows a circuit diagram of a part of the first and second row decoders when those decoders are disposed on one side of the memory cell array.

The first and second row decoders 10 and 14, and the memory cell array (including memory cells M11 to MNL and DM11 to DM2L) are generally laid out on a semiconductor chip CP, as shown in FIG. 4. As shown, the memory cell array is disposed between the decoders 10 and 14. This layout is free from redundancy in the wire pattern on the semiconductor chip including the word lines W1 to W(N+2). There may be a case, however, wherein these components cannot be laid out as shown in FIG. 4. In such a case, the switching circuits SA1 to SA(N+1) and SB1 to SB(N+2) may be constructed with AND gates 34-1 to 34-(N+2) and 36-1 to 36-(N+2). As well, OR gates 38-1 to 38-(N+2) may be used for the rows of the matrices of the memory cells M11 to MNL and DM11 to DM2L. In this alternative, the word line W1, for example, receives a select signal from the AND gates 34-1 and 36-1, via the OR gate 38-1, as shown in FIG. 5. Accordingly, therefore, the wire pattern on the semiconductor chip can be simplified.

Figure 6:
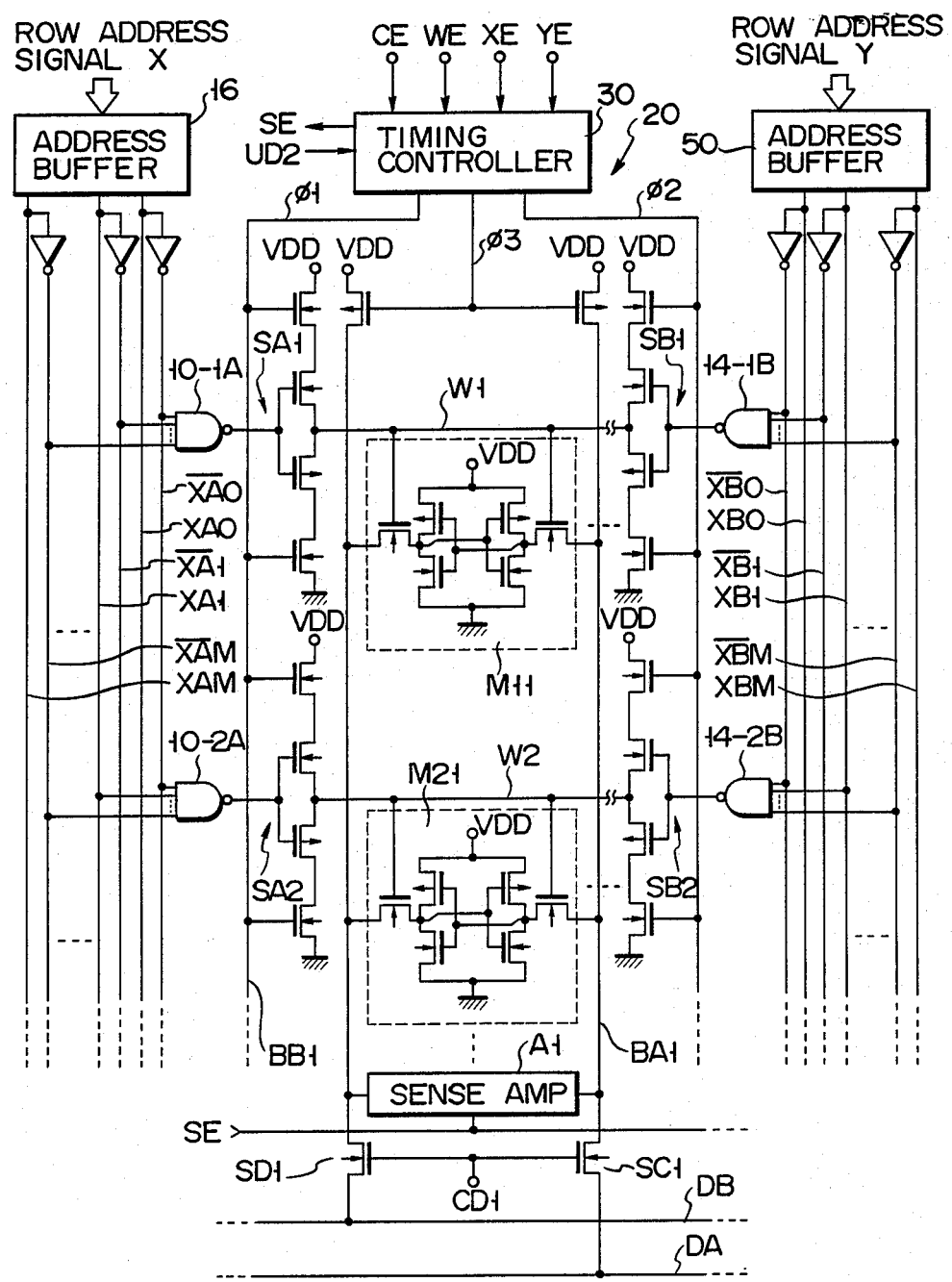
FIG. 6 shows a circuit diagram of a part of a semiconductor memory device according to another embodiment of this invention.

Another embodiment of a semiconductor memory device according to this invention will be given referring to FIG. 6. FIG. 6 shows the details of a part of the memory device. The memory device has substantially the same construction as that of the first embodiment, with the exception of the circuit portion given below. In FIG. 6, similar portions are designated by the same reference numerals for simplicity. Each memory cell M11 to MNL of the memory device includes, for example, six MOS transistors which form a one bit static memory. The first and second data terminals of the memory cell are coupled with the paired bit lines BA1 and BB1 to BAL and BBL in the corresponding column. When the static type memory cells are used, there is no need for the leak sensing circuit 32, the refresh address generator 18, the dummy memory cells DM11 to DM2L, and the circuitry to actuate the dummy memory cells DM11 to DM2L. In this embodiment, the address buffer 16 does not include the transition detector. An address buffer 50 with the same structure as that of the address buffer 16 is provided in place of the refresh address generator 18 in the first embodiment. The address buffers 16 and 50, receive and latch row address signals X and Y, respectively, and supply the latched signals X and Y to the first and second row decoders 10 and 14. The timing controller 30 is connected for reception to address enable signals XE and YE, synchronized with updating the row address signals X and Y. The timing controller 30 responds to the address enable signal XE, and produces both control signals $\phi 1$, $\phi 3$, $\phi 4$ and a sense enable signal SE at timings similar to those of the first embodiment. The timing controller 30, responding to the address enable signal YE, produces control signals $\phi 2$, $\phi 3$, $\phi 4$ and a sense enable signal SE at timings similar to those for generating the signals $\phi 1$, $\phi 3$, $\phi 4$ and SE. Switching circuits SA1 to SAN and SB1 to SBN may be clocked CMOS inverters The first and second row decoders 10 and 14 of this embodiment substitute NAND gates 10-1A to 10-NA and 14-1B to 14-NB for the AND gates 10-1 to 10-N and 14-1 to 14-N which were used in the previous embodiment.

In this embodiment, the update timings of the address signals X and Y must be set so that when the bit lines BA1 to BAL and BB1 to BBL are employed for the read/write operation of the memory cells as specified by one of the row address signals X and Y, those lines are not employed for the read/write operation of the memory cells as specified by another signal. This memory device can decode the row address signal Y when the specific row of the matrix of the memory cells M11 to MNL is selected by the row address signal X. Therefore, the updating cycles of the row address signals X and Y can be reduced by the times equal to the time delays in the row decoders 10 and 14, respectively.

Also in this embodiment, when the supply of the address enable signals XE and YE is stopped, the decoding of the address signals X and Y is omitted. In other words, use or non use of the updated address signals X and Y may be selected by the address signals XE and YE.

It is evident that this invention is applicable to not only dynamic and static RAMs, but also SRAM, EPROM, PROM, E²PROM, and the like.

What is claimed is:

1. A semiconductor memory device comprising:
   first and second decoding means for decoding, respectively, first and second address signals into output signals;
   selecting means connected to said first and second decoding means for selecting one of said output signals of said first and second decoding means; and
   memory means for storing data therein, said memory means including a plurality of word lines and a plurality of memory blocks which are connected to said selecting means via respective word lines, each of said respective word lines coupled to receive the output signals from said first and said second decoding means in accordance with the selection of the output signals as controlled by said selecting means, said memory means being selectively addressed by the selected one of said output signals from said first and second decoding means.

2. A semiconductor memory device according to claim 1, wherein each of said memory blocks includes a plurality of memory cells connected to a corresponding one of said word lines.

3. A semiconductor memory device according to claim 2, wherein said selecting means includes a first gating circuit for transferring the output signal of said first decoding means to said word lines, and a second gating circuit for transferring the output signal of said second decoding means to said word lines.

4. A semiconductor memory device according to claim 3, wherein said selecting means includes an address buffer which generates a detection signal indicating that the first address signal has been updated, and a timing controller which permits, in response to said detection signal, said first gating circuit to transfer the output signal of said first decoding means.

5. A semiconductor memory device according to claim 3, further comprising refresh means for periodically generating a refresh address signal as said second address signal.

6. A semiconductor memory device according to claim 5, wherein said refresh means includes a refresh request generator for periodically generating a refresh request signal and a refresh address generator for generating a refresh address signal in response to the refresh request signal.

7. A semiconductor memory device according to claim 6, wherein said selecting means includes an address buffer which generates a detection signal indicating that the first address signal has been updated, and a timing controller which permits, in response to said detection signal, said first gating circuit to transfer the output signal of said first decoding means for a predetermined period which corresponds to a read/write time for each of said memory cells, and permits, in response to said refresh request signal, said second gating circuit to transfer the output signal of said second decoding means after said first predetermined period has elapsed.

8. A semiconductor memory device according to claim 7, wherein said memory means is located between said first and second decoding means on a semiconductor chip.

9. A semiconductor memory device according to claim 8, wherein said memory blocks and said word lines are arranged in a first direction, said first decoding means includes first combination circuits arranged in said first direction and first address lines connected to receive said first address signal for supplying said first address signal to said first combination circuits, and second decoding means includes second combination circuits arranged in said first direction and second address lines connected to receive said second address signal for supplying said second address signal to said second combination circuits.

10. A semiconductor memory device according to claim 9, wherein said timing controller responds to said detection signal with a predetermined time delay which is longer than the time required for the first decoding means to decode the first address signal.

11. A semiconductor memory device according to claim 10, wherein said first gating circuit includes a plurality of transfer gates connected to receive first signals output by the respective first combination circuits, and said second gating circuit includes a plurality of transfer gates connected to receive second signals output by the respective second combination circuits.

12. A semiconductor memory device according to claim 11, wherein said transfer gate is a MOS transistor, and said combination circuit is an AND gate.

13. A semiconductor memory device according to claim 12, wherein said transfer gate is a clocked CMOS inverter, and said combination circuit is a NAND gate.

* * * * *